(12) United States Patent
Kohler et al.

(10) Patent No.: US 7,613,061 B2
(45) Date of Patent: Nov. 3, 2009

(54) METHOD AND APPARATUS FOR IDLE CYCLE REFRESH REQUEST IN DRAM

(75) Inventors: Ross A. Kohler, Allentown, PA (US); Richard J McPartland, Nazareth, PA (US); Wayne E Werner, Coopersburg, PA (US)

(73) Assignee: Agere Systems Inc., Allentown, PA (US)

( * ) Notice: Subject to any disclaimer, the term of this patent is extended or adjusted under 35 U.S.C. 154(b) by 24 days.

(21) Appl. No.: 11/948,214

(22) Filed: Nov. 30, 2007

(65) Prior Publication Data

US 2009/0141575 A1  Jun. 4, 2009

(51) Int. Cl.
*G11C 7/00* (2006.01)

(52) U.S. Cl. ............. 365/222; 365/233.11; 365/233.15; 365/239

(58) Field of Classification Search ................. 365/222, 365/233.11, 233.15, 239
See application file for complete search history.

(56) References Cited

U.S. PATENT DOCUMENTS

| | | | |
|---|---|---|---|
| 6,222,785 B1* | 4/2001 | Leung | 365/222 |
| 7,043,598 B2* | 5/2006 | Wu et al. | 365/230.01 |
| 2001/0008496 A1* | 7/2001 | Leung | 365/223 |
| 2002/0056022 A1* | 5/2002 | Leung | 711/106 |

\* cited by examiner

*Primary Examiner*—Thong Q Le
(74) *Attorney, Agent, or Firm*—Ryan, Mason & Lewis, LLP

(57) ABSTRACT

Generally, methods and apparatus are provided for idle cycle refresh request in a dynamic random access memory. According to one aspect of the invention, a dynamic random access memory is refreshed by determining if a refresh of the dynamic random access memory is required; and allocating an idle cycle sequence to refresh at least a portion of the dynamic random access memory only if the determining step determines that a refresh of the dynamic random access memory is required. A refresh flag can optionally be set if a refresh is required. The idle cycle sequence comprises one or more idle cycles. The idle cycle sequence can optionally be allocated within a predefined duration of the refresh flag being set. The step of determining step whether a refresh of the dynamic random access memory is required can be based on real-time or expected conditions.

18 Claims, 4 Drawing Sheets

US 7,613,061 B2

METHOD AND APPARATUS FOR IDLE CYCLE REFRESH REQUEST IN DRAM

FIELD OF THE INVENTION

The present invention relates generally to refresh techniques for dynamic random access memories, and more particularly, to refresh techniques for such dynamic random access memories that exhibit improved data transfer rates between the user system and the memory

BACKGROUND OF THE INVENTION

Dynamic Random Access memories (DRAM) contain an array of DRAM memory cells and supporting circuitry Embedded DRAM (eDRAM) is usually integrated on the same die or in the same package as the main processor (or application specific integrated circuit), as opposed to external DRAM modules. Unlike Static Random Access Memory (SRAM), DRAM memory cells must be refreshed (i e, they must be read and re-written periodically in order to retain data). The refresh operation is required because data is stored in the form of a charge within a capacitor and that charge slowly leaks from the capacitor.

Idle cycle refresh (ICR) is a common refresh control method for eDRAM. ICR requires a system using eDRAM to reserve clock cycles during which the eDRAM is refreshed. During the reserved refresh clock cycles, the eDRAM cannot be accessed for a read or a write operation. Thus, the data transfer rate between the system and eDRAM is reduced by the percentage of cycles that are reserved for ICR (typically as much as a 6% reduction). Based on a typical ICR implementation, the eDRAM reserves more idle cycles than it actually needs and uses for refresh cycles. Generally, the frequency of cycles reserved for idle cycles is often specified based upon a worst case scenario, such as a fast silicon process and/or an operating environment that has the highest memory cell leakage. It is thus desirable to improve the data transfer rate between eDRAM and the user system by only reserving idle cycles that the eDRAM actually needs and will use for refresh cycles.

SUMMARY OF THE INVENTION

Generally, methods and apparatus are provided for idle cycle refresh request in a dynamic random access memory. According to one aspect of the invention, a dynamic random access memory is refreshed by determining if a refresh of the dynamic random access memory is required; and allocating an idle cycle sequence to refresh at least a portion of the dynamic random access memory only if the determining step determines that a refresh of the dynamic random access memory is required. A refresh flag can optionally be set if a refresh is required. The idle cycle sequence comprises one or more idle cycles. In one variation, the idle cycle sequence comprises at least one cycle for a read or write operation between two idle cycles.

The idle cycle sequence can optionally be allocated within a predefined duration of the refresh flag being set. For example, the predefined duration can be a next cycle after the refresh flag is set. The step of determining step whether a refresh of the dynamic random access memory is required can be based on real-time or expected conditions, such as charge leakage, operating temperature and operating voltage.

A more complete understanding of the present invention, as well as further features and advantages of the present invention, will be obtained by reference to the following detailed description and drawings.

DETAILED DESCRIPTION

Figure 1:
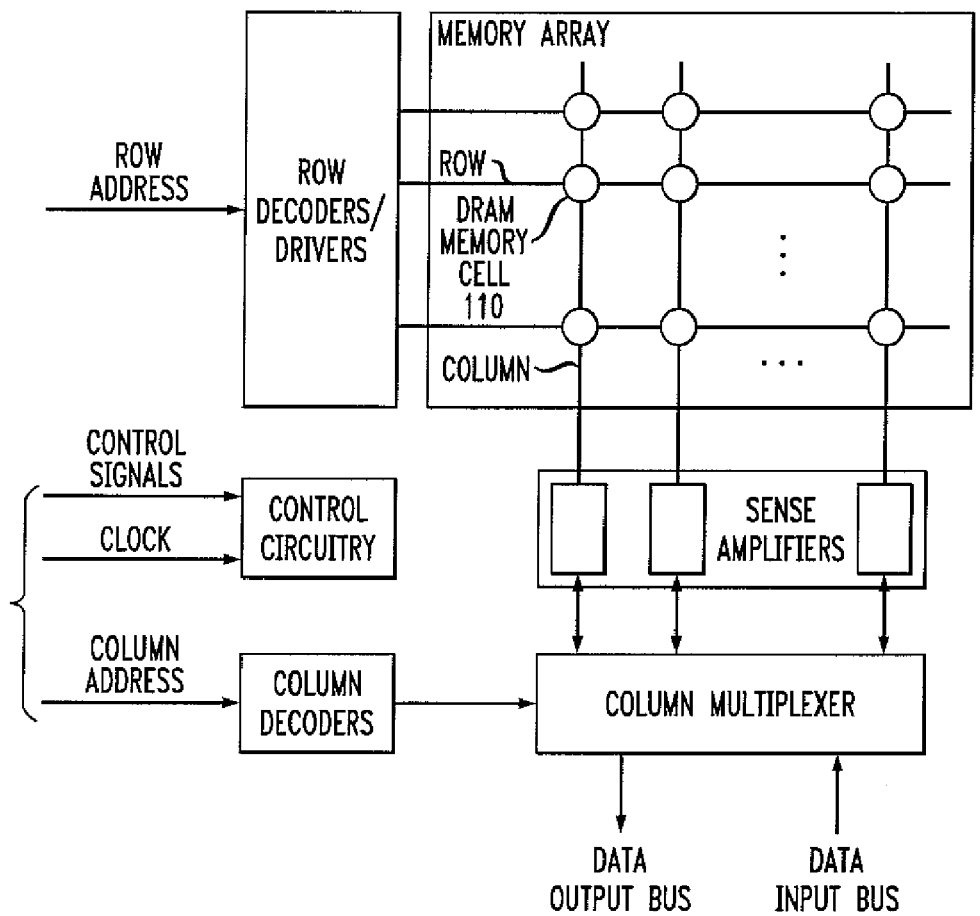
FIG. 1 is a schematic block diagram of a conventional DRAM memory.
Figure 2:
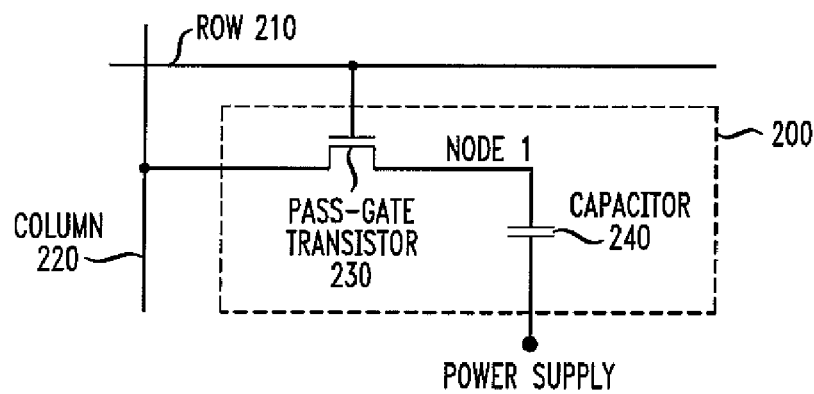
FIG. 2 is a schematic of a DRAM cell of the DRAM memory of FIG. 1.

FIG. 1 is a schematic block diagram of a conventional DRAM memory 100. As shown in FIG. 1, the DRAM 100 comprises an array of DRAM memory cells 110 (discussed further below in conjunction with FIG. 2) and supporting circuitry 120, in a known manner FIG. 2 is a schematic of a DRAM cell 200 connected to a row 210 and to a column 220. The cell 200 comprises a pass-gate transistor 230 and a capacitor 240. One side of the capacitor 240 is connected to a power supply at some fixed voltage. The other side of the capacitor 240 is connected to the pass-gate transistor 230 at node 1.

The charge stored on the capacitor 240, as represented by the voltage on node 1, represents one of two binary data-states (0 or 1). For example, 0 volts might represent data-state 0 and 1 volt might represent data-state 1. Writing the cell involves storing charge in the capacitor 240 representing one of these voltage levels on node 1. The charge comes from the column 220 through the pass-gate transistor 230. Reading the cell involves draining charge from the capacitor 240 through the pass-gate transistor 230 and onto the column 220. A read is destructive in that it removes charge from the capacitor 240 so that the read data-state is no longer stored within the cell 200. The method and circuits for reading and writing DRAM cells 200 are well known in the art.

The data-state is stored as charge within the capacitor 240. This charge can leak from the capacitor by a number of well known paths. Typically, the leakage paths include sub-threshold leakage through the pass-gate transistor 230 onto the column 220; leakage through the source-drain junction of the pass-gate transistor 230, which is connected to node 1; and leakage through the dielectric of the capacitor 240 onto the power supply. Charge typically leaks from the capacitor 240 with sub-second time constants. Thus, as indicated above, DRAM memory cells 200 need to be refreshed at regular intervals, which are typically fractions of a second. For eDRAM, refresh intervals as short as 100 us are not uncommon.

A refresh operation consists of reading the cell and writing the same data back into the cell 200. Reading the cell 200 moves the charge from its capacitor 240 trough the pass-gate transistor 230 and onto its associated column 220. This makes a relatively small change in the column's voltage. The column voltage change is sensed by a sense amplifier connected to the column (see FIG. 1). From the column voltage change, the sense amplifier recognizes the data-state which was in the cell 200. The sense amplifier further drives the column voltage, moving it to an extreme level representative of the data-state previously contained in the cell, typically 0 or 1 volt. This amplified column voltage is transferred through the pass-gate transistor 230 and onto node 1, replenishing the charge stored in the capacitor 240 so that the charge stored is again fully representative of the original data-state.

Idle cycle refresh (ICR) is commonly used for controlling refresh in eDRAM. The controlling system is required to periodically provide an idle cycle. An idle cycle might be required before the elapse of a specific time interval, for example 200 ns. Alternately, an idle cycle might be required after the execution of a specific number of cycles, for example, every 32 cycles. The timing of the idle cycle frequency requirement is usually based upon the expected cell leakage for a chip manufactured with processing having the highest cell leakage that is expected to occur in normal manufacture. It is also usually based upon a chip operating at the worst case voltage and temperature within the specified operating range, typically the highest operating voltage and hottest temperature. Under these conditions, charge leaks from the cell capacitor most rapidly and therefore need to be refreshed most often. When the memory is operated at lower temperature and/or lower voltage, or when the chip is manufactured with processing that does not cause maximum leakage from the cell's capacitor, charge leaks from the cell capacitor more slowly and refresh is not needed as often.

Figure 3:
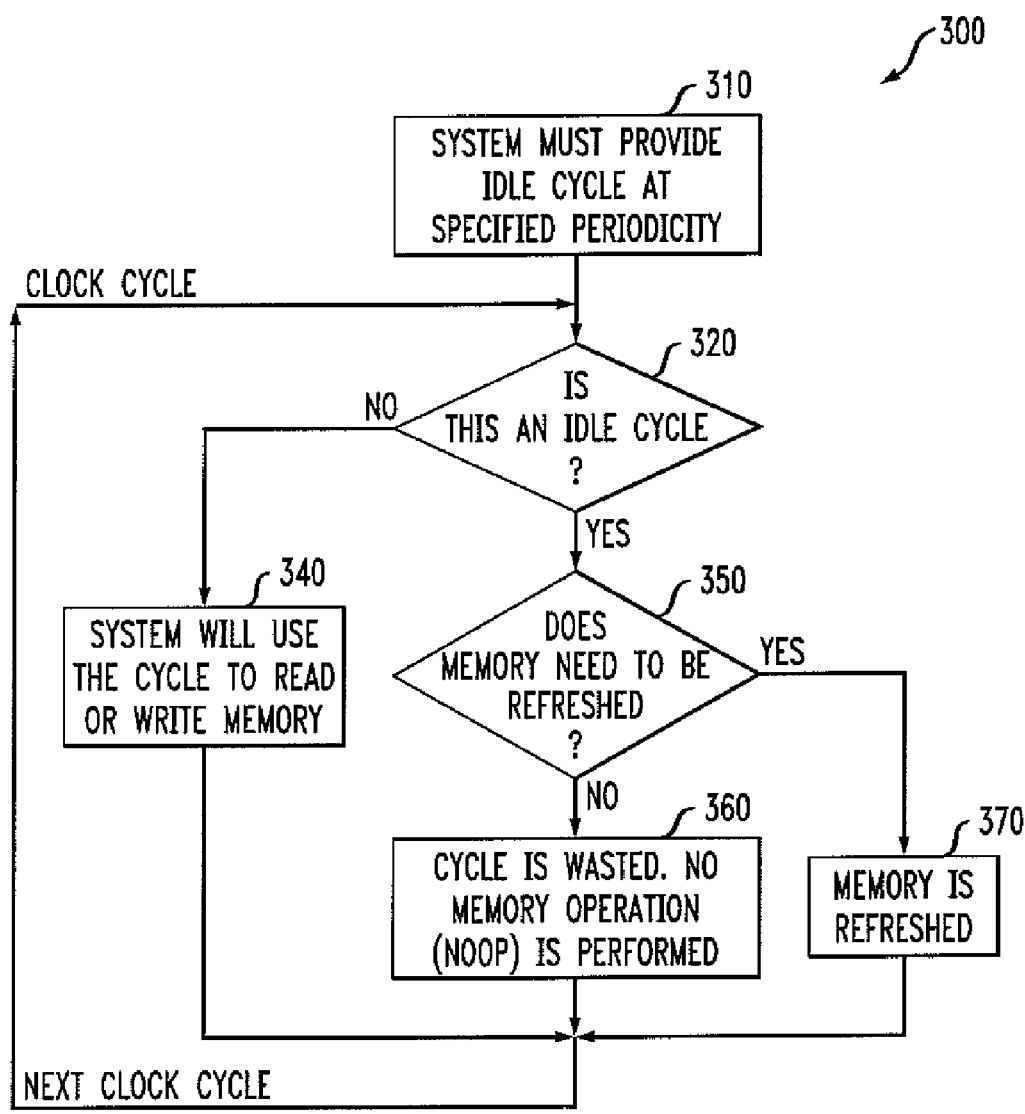
FIG. 3 illustrates a conventional idle cycle refresh process.

FIG. 3 illustrates a conventional idle cycle refresh process 300. It is noted that idle cycles are memory clock cycles where the memory is not instructed to read or write. To the user system, idle cycles are no-operation (NOOP) cycles. Idle cycle refresh requires a periodic idle cycle which can be used to perform a refresh operation within the memory. As show in FIG. 3, the idle cycle refresh process 300 provides idle cycles during step 310 at a specified periodicity. For example, idle cycles may be required once every specified number of cycles, for example, one idle cycle for every 32 cycles. Alternately, idle cycles may be required based upon time interval, for example, one idle cycle for every 200 ns.

If there is no read or write instruction to the memory, step 320 determines that the current cycle is an idle cycle. If there is a read or write instruction to the memory, step 320 determines that the current cycle is not an idle cycle. If it is determined during step 320 that the current cycle is not an idle cycle, then the cycle will be used for a read or write operation during step 340. If, however, it is determined during step 320 that the current cycle is an idle cycle, then a further test is performed during step 350 to determine if the memory needs to be refreshed.

If it is determined during step 350 that the memory does not need to be refreshed, then the cycle is wasted during step 360 as no memory operation is performed (a NOOP) (unnecessarily reducing the data rate of the memory with the user system). If, however, it is determined during step 350 that the memory does need to be refreshed, then the memory is refreshed during step 370. When the memory needs to refresh, idle cycles are used for refresh cycles. Program control then returns to step 320 to process the next clock cycle.

Idle Cycle Refresh Request

According to one aspect of the present invention, an idle cycle refresh is provided that only requests idle cycles when the memory actually needs to perform a refresh cycle. In this manner, cycles are not wasted for unneeded refresh operations that are not performed, in that they do not go unused, and the data rate is minimally reduced by idle cycle refreshes. Unlike the above-described conventional techniques, the disclosed ICR request techniques do not require idle cycles at regular specified intervals. Rather, embodiments of the present invention use an output flag to inform the user that an idle cycle or a sequence of idle cycles are needed. The flag can be, for example, an output signal from the memory to tell the system that it needs to refresh and that the system is now required to provide the idle cycle or sequence of idle cycles. The system must respond within some specified number of cycles (X) (or within some specified time period) by initiating the required ICS. As used herein, an "idle cycle sequence (ICS)" is one or more idle cycles that may or may not be adjacent cycles, but are in a specified pattern (e.g., one out of every eight cycles) and of a specified number.

Figure 4:
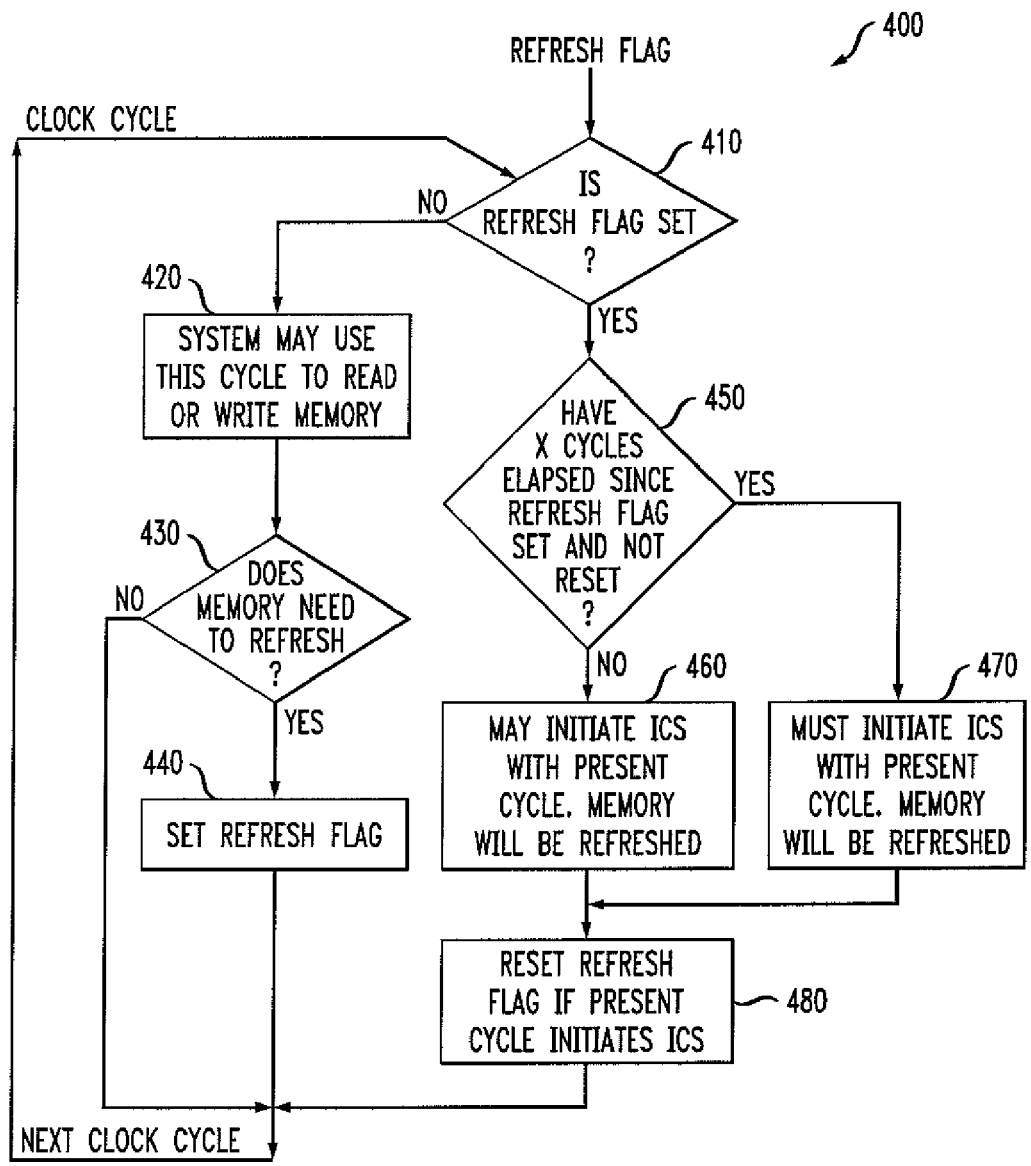
FIG. 4 is a flow chart illustrating an idle cycle refresh process incorporating a refresh flag in accordance with an embodiment of the present invention.

FIG. 4 is a flow chart illustrating an idle cycle refresh process 400 incorporating a refresh flag in accordance with an embodiment of the present invention. As shown in FIG. 4, the idle cycle refresh process 400 initially determines, during step 410, whether a refresh flag is set. If the flag has not been set, the system can use this cycle to read or write memory during step 420. A further test is performed during step 430 to determine if the memory needs to refresh. If it is determined during step 430 that the memory does not need to refresh, then program control returns directly to step 410 to process the next clock cycle. If however, it is determined during step 430 that the memory does need to refresh, then program control proceeds to step 440 to set the refresh flag, which will then be processed on the next clock cycle. Program control returns directly to step 410 to process the next clock cycle.

If it is determined during step 410 that the refresh flag has been set, a further test is performed during step 450 to determine if a predefined number (X) of cycles have elapsed since the refresh flag was set and not reset. If it is determined during step 450 that the predefined number (X) of cycles have not elapsed, then the system may, but is not required to, initiate an ICS with present cycle during step 460, where the memory is refreshed if and only if an ICS was initiated. If, however, it is determined during step 450 that the predefined number (X) of cycles have elapsed, then the system must initiate an ICS with the present cycle. Thus, the memory is refreshed. The refresh flag is reset during step 480 if the present cycle initiates an ICS. Program control returns directly to step 410 to process the next clock cycle.

There are a number of variations in the way that the idle cycle refresh with refresh flag can be implemented. A first variation relates to how many cycles may elapse between setting the refresh flag and supplying the idle cycle sequence. In the general case shown in FIG. 4, the first cycle of the ICS must start within a specified number of cycles (X) after the refresh flag is set. For example, the ICS may not have to start until 32 clock cycles after the refresh flag is set. In this case, the ICS may start anywhere from the first to the thirty-second cycle after the refresh flag is set.

Figure 5:
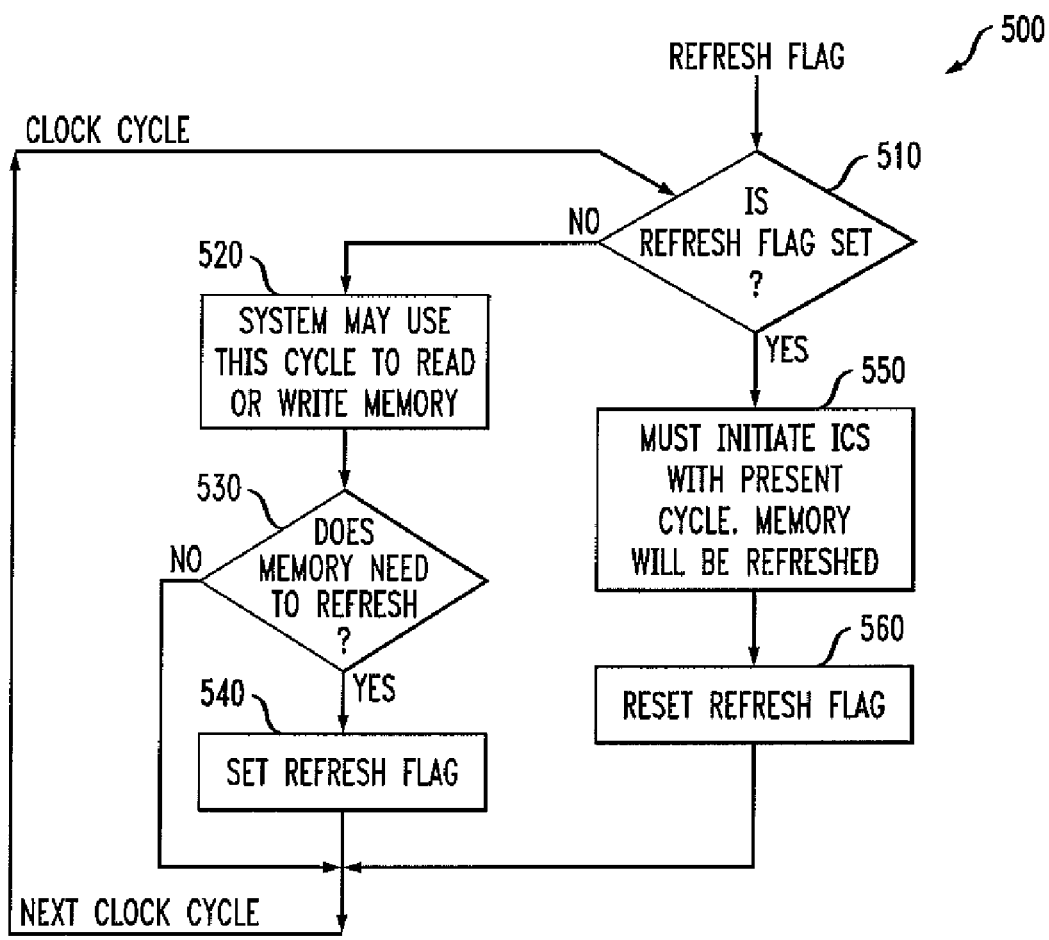
FIG. 5 is a flow chart illustrating an idle cycle refresh process incorporating a refresh flag in accordance with an alternate embodiment of the present invention.

In a further variation, shown in FIG. 5, the cycle after the refresh flag is set is required to be the first cycle of the idle cycle sequence (ICS). FIG. 5 is a flow chart illustrating an idle cycle refresh process 500 incorporating a refresh flag in accordance with an alternate embodiment of the present invention. As shown in FIG. 5, the idle cycle refresh process 500 initially determines, during step 510, whether a refresh flag is set. If the flag has not been set, the system can use this cycle to read or write memory during step 520. A further test is performed during step 530 to determine it the memory needs to refresh. If it is determined during step 530 that the memory does not need to refresh, then program control returns directly to step 510 to process the next clock cycle. If however, it is determined during step 530 that the memory does need to refresh, then program control proceeds to step 540 to set the refresh flag, which will then be processed on the next clock cycle. Program control returns directly to step 510 to process the next clock cycle.

If it is determined during step 510 that the refresh flag has been set, then the system initiates an ICS with the present cycle during step 550. Thus, the memory is refreshed. The refresh flag is reset during step 560. Program control returns to step 510 to process the next clock cycle.

The second variation in the way that the idle cycle refresh with refresh flag can be implemented relates to the idle cycle sequence. The ICS may be as simple as a single idle cycle. In this case, for the embodiment shown in FIG. 5, the first cycle after setting of the refresh flag would be an idle cycle which would be the complete ICS. For the more general case shown in FIG. 4, an example of a single idle cycle being the complete ICS is one idle cycle occurring within 32 clock cycles after setting of the refresh flag. Typically, one idle cycle is associated with the refresh of one row within the memory. Although when there are multiple arrays within the memory, there may be cases where multiple rows, but generally only one in any given array, are refreshed within a single idle cycle.

A longer ICS would consist of more than one idle cycle. In the extreme case, the ICS may consist of enough idle cycles to refresh the entire memory. Typically, this would be the same number of idle cycles as the number of rows within the memory or within one or more arrays for a multi-array memory. For example, an ICS would consist of 1024 idle cycles for a 1024 row memory. An intermediate ICS would be more than one but less than the maximum number of idle cycles needed to refresh the entire memory. The disadvantage of a long ICS with adjacent idle cycles is that the memory is not accessible for data transfer (reading or writing) during the adjacent sequential cycles of the ICS.

Alternately, an ICS consisting of more than one idle cycle may space out the required idle cycles by having cycles that the system can use for reading or writing between the idle cycles. For example, if the ICS consists of 1024 idle cycles, the idle cycles could be spaced out to provide one idle cycle every 32 cycles. In this way, the system has the opportunity for data transfer during the ICS for almost 97% of the time.

Among other benefits of the present invention, the data transfer rate is reduced only during an actual refresh, that is, during the time occupied by the ICS. Between idle cycle sequences, when the memory is not being refreshed, there are no idle cycles and the data transfer rate is not reduced.

In one embodiment, setting of the refresh flag should be dependent on the operating temperature and operating voltage of the chip. Typically, this would mean that when the chip is colder or operating at a lower voltage, the refresh flag is set less often. When the chip is hotter or when the voltage is higher, the refresh flag is set more often. Chips that are manufactured or processed in such a way that charge leaks from the capacitor faster would also cause the refresh flag to be set more often than chips that are manufactured or processed in such a way that charge leaks from the capacitor more slowly. For a detailed discussion of suitable techniques for adjusting internal circuits based on process, temperature and voltage variations (i.e., setting the refresh flag, using process, voltage and/or temperature sensing), see, for example, U.S. patent application Ser. No. 11/860,896, filed on Sep. 25, 2007, entitled "Integrated Circuit Having a Memory with Process-Voltage-Temperature Control," incorporated by reference herein.

The techniques described herein can be implemented with logic within the embedded memory macro. Currently, ICR is controlled in this way. Alternatively, the disclosed techniques could be controlled by a processor or a refresh controller external to the memory.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

It is to be understood that the embodiments and variations shown and described herein are merely illustrative of the principles of this invention and that various modifications may be implemented by those skilled in the art without departing from the scope and spirit of the invention.

We claim:

1. A method for refreshing a dynamic random access memory, comprising:
   determining if a refresh of said dynamic random access memory is required; and
   allocating an idle cycle sequence to refresh at least a portion of said dynamic random access memory only if said determining step determines that a refresh of said dynamic random access memory is required;
   wherein said determining step determines if a refresh of said dynamic random access memory is required based on real-time conditions.

2. The method of claim 1, further comprising the step of setting a refresh flag if a refresh is required.

3. The method of claim 1, wherein said idle cycle sequence comprises one or more idle cycles.

4. The method of claim 1, wherein said idle cycle sequence comprises at least one cycle for a read or write operation between two idle cycles.

5. The method of claim 1, wherein said allocating step allocates said idle cycle sequence within a predefined duration of said refresh flag being set.

6. The method of claim 5, wherein said predefined duration is a next cycle after said refresh flag is set.

7. The method of claim 1, wherein said real-time conditions comprise one or more of real-time charge leakage, operating temperature and operating voltage.

8. The method of claim 1, wherein said determining step further determines if a refresh of said dynamic random access memory is required based on expected conditions.

9. The method of claim 8, wherein said expected conditions comprise one or more of charge leakage, operating temperature and operating voltage.

10. A logic system for refreshing a dynamic random access memory, comprising:
   a logic circuit for determining if a refresh of the dynamic random access memory is required; and
   a logic circuit for allocating an idle cycle sequence to refresh at least a portion of the dynamic random access memory only if the determining step determines that a refresh of the dynamic random access memory is required;
   wherein the logic circuit for determining determines if a refresh of the dynamic random access memory is required based on real-time conditions.

11. The logic system of claim 10, further comprising a logic circuit to set a refresh flag if a refresh is required.

12. The logic system of claim 10, wherein the idle cycle sequence comprises at least one cycle for a read or write operation between two idle cycles.

13. The logic system of claim 10, wherein the logic circuit for allocating allocates the idle cycle sequence within a predefined duration of the refresh flag being set.

14. The logic system of claim 10, wherein the real-time conditions comprise one or more of real-time charge leakage, operating temperature and operating voltage.

15. The logic system of claim 10, wherein the logic circuit for determining further determines if a refresh of the dynamic random access memory is required based on expected conditions.

16. The logic system of claim 15, wherein the expected conditions comprise one or more of charge leakage, operating temperature and operating voltage.

17. A system for refreshing a dynamic random access memory, comprising:
   a memory; and
   at least one processor, coupled to the memory, operative to:
   determine if a refresh of said dynamic random access memory is required; and
   allocate an idle cycle sequence to refresh at least a portion of said dynamic random access memory only if said determining step determines that a refresh of said dynamic random access memory is required;
   wherein said processor determines if a refresh of said dynamic random access memory is required based on real-time conditions.

18. The system of claim 17, wherein said processor further determines if a refresh of said dynamic random access memory is required based on expected conditions.

* * * * *